United States Patent
Kanda et al.

(10) Patent No.: US 9,853,606 B2
(45) Date of Patent: Dec. 26, 2017

(54) SEMICONDUCTOR INTEGRATED CIRCUIT AND WIRELESS TRANSMITTER

(71) Applicant: FUJITSU LIMITED, Kawasaki-shi, Kanagawa (JP)

(72) Inventors: Kouichi Kanda, Chofu (JP); Shoichi Masui, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/083,629

(22) Filed: Mar. 29, 2016

(65) Prior Publication Data

US 2016/0211806 A1    Jul. 21, 2016

Related U.S. Application Data

(63) Continuation of application No. PCT/JP2013/078349, filed on Oct. 18, 2013.

(51) Int. Cl.
*H03F 1/12* (2006.01)
*H04B 1/04* (2006.01)
(Continued)

(52) U.S. Cl.
CPC .............. *H03F 1/12* (2013.01); *H03F 1/56* (2013.01); *H03F 3/16* (2013.01); *H03F 3/193* (2013.01);
(Continued)

(58) Field of Classification Search
CPC ..... H03F 1/12; H03F 1/56; H03F 3/16; H03F 3/193; H03F 3/245; H03F 2200/211;
(Continued)

(56) References Cited

U.S. PATENT DOCUMENTS 5,049,841 A * 9/1991 Cooper ................ H03G 1/0088
                                                   333/81 R
6,181,922 B1    1/2001    Iwai et al.
(Continued)

FOREIGN PATENT DOCUMENTS

EP          0741452 A2     11/1996
JP          08-288791      11/1996
(Continued)

OTHER PUBLICATIONS

EESR—The Extended European Search Report dated Sep. 29, 2016 from corresponding European Patent Application No. 13895672.7.
(Continued)

*Primary Examiner* — Khanh V Nguyen
(74) *Attorney, Agent, or Firm* — Fujitsu Patent Center

(57) ABSTRACT

A semiconductor integrated circuit includes a first transmission power mode configured to transmit by a first power, and a second transmission power mode configured to transmit by a second power smaller than the first power, the semiconductor integrated circuit. The semiconductor integrated circuit includes a first transistor configured to receive and amplify a transmission signal in the second transmission power mode, and an attenuator including a resistor element and a switching element, provided between an output of the first transistor and an output terminal, configured to control attenuation of an output signal of the first transistor.

9 Claims, 8 Drawing Sheets

(51) Int. Cl.
*H03F 3/16* (2006.01)
*H04W 52/04* (2009.01)
*H03F 1/56* (2006.01)
*H03F 3/193* (2006.01)
*H03F 3/24* (2006.01)
*H03G 1/00* (2006.01)
*H03G 3/30* (2006.01)
*H01P 1/22* (2006.01)

(52) U.S. Cl.
CPC .......... *H03F 3/245* (2013.01); *H03G 1/0088* (2013.01); *H03G 3/3042* (2013.01); *H04B 1/0458* (2013.01); *H04W 52/04* (2013.01); *H01P 1/22* (2013.01); *H03F 2200/211* (2013.01); *H03F 2200/423* (2013.01)

(58) Field of Classification Search
CPC ....... H03F 1/565; H03F 3/191; H03G 1/0088; H03G 3/3042; H04B 1/0458; H04W 52/04; H01P 1/22
USPC ......................................................... 330/284
See application file for complete search history.

(56) References Cited

U.S. PATENT DOCUMENTS 8,461,929 B2 * 6/2013 Yamamoto ................ H03F 1/56
330/284
8,471,637 B2 * 6/2013 Hoogzaad ................ H03F 1/22
330/284
8,786,784 B2 * 7/2014 Magnusen ........... H03G 1/0088
348/678
8,928,414 B2 * 1/2015 Roux ........................ H03F 1/22
330/311

FOREIGN PATENT DOCUMENTS

| | | |
|---|---|---|
| JP | 2006-060729 | 3/2006 |
| JP | 2007-335959 | 12/2007 |
| JP | 2010-141758 | 6/2010 |
| JP | 2010-177824 | 8/2010 |
| WO | 2007/104055 A2 | 9/2007 |

OTHER PUBLICATIONS

International Search Report and Written Opinion of the International Searching Authority (Form PCT/ISA/210, Form PCT/ISA/237), mailed in connection with PCT/JP20131078349 and dated Jan. 28, 2014 (10 pages).
JPOA—Office Action of Japanese Patent Application No. 2015-542473 dated Dec. 20, 2016, with partial English translation of the Office Action.

* cited by examiner (a)

(b)

(a)

(b)

| | TRANSMISSION POWER OF −10dB | TRANSMISSION POWER OF −50dB |
|---|---|---|
| CNT1 | 1 | 0 |

(a)

(b)

(a)

(b)

|  | TRANSMISSION POWER OF −10dB | TRANSMISSION POWER OF −50dB |
|---|---|---|
| CNT11 | 0 | 1 |
| CNT12 | 1 | 0 |
| CNT13 | 1 | 0 |

(a)

(b)

SEMICONDUCTOR INTEGRATED CIRCUIT AND WIRELESS TRANSMITTER

CROSS-REFERENCE TO RELATED APPLICATION

This application is a continuation application and is based upon PCT/JP2013/078349, filed on Oct. 18, 2013, the entire contents of which are incorporated herein by reference.

FIELD

Embodiments discussed herein relate to a semiconductor integrated circuit and a wireless transmitter.

BACKGROUND

In recent years, a short-range and low-power radio system realizing a body area network (BAN: Body Area Network) and a sensor network (WSN: Wireless Sensor Networks) have been gaining attention.

Note that, the BAN is a short-range radio network, and for example, which realizes data exchanging within a range of about several meters between a human body and its surroundings. By using this BAN, for example, to attach a large number of brain wave sensors (EEG: Electroencephalography electrodes) on a human head, to perform brain wave monitor of large amounts of data from their brain wave sensors by wireless transmission, or wireless transmission of image data output from a capsule endoscopy medical.

Further, WSN is, for example, interspersed with a plurality of sensor terminals, and those sensor terminals are connected each other by a wireless network, and is considered to be applied to various fields.

The short-range wireless standard that realizes the above described BAN and WSN is, for example, proposed various ones, such as IEEE802.15.6 and ZigBee (registered trademark).

As described above, in a transmitter conforming to the short-range wireless standard such as IEEE802.15.6 and ZigBee (registered trademark), for example, it is difficult to achieve high data transfer rates required for applications such as EEG monitor or image transfer.

Therefore, the wireless communication apparatus includes a unique high-speed mode (high-speed data transfer mode) in addition to the standard data transfer mode, and the user may select and use a preferable data transfer modes by switching software manner.

Note that, when realizing a high-speed mode by bundling a plurality of channels, the strength of electromagnetic wave radiated from an antenna should be limited by the provision of low-power radio regulations, and thus the maximum transmit power may be limited about 30 dB to 40 dB lower than the standard power. Therefore, it is preferable for the transmitter to realize both transmission power of −10 dBm and −50 dBm depending on operating modes.

In general, the specified low-power radio equipment may be realized by inserting a fixed attenuator to an outside of a semiconductor integrated circuit (LSI chip) or by shifting a matching between an antenna and the LSI chip, and to achieve an ultra-low transmission power such as −50 dBm. However, in this method, for example, it is difficult to be used by switching the transmission power of both −10 dBm and −50 dBm.

Conventionally, as a wireless communication technology capable of switching between different transmission power modes, various proposals have been made.

Patent Document 1: Japanese Laid-open Patent Publication No. 2010-141758

SUMMARY

According to one embodiment, there is provided a semiconductor integrated circuit including a first transmission power mode configured to transmit by a first power, and a second transmission power mode configured to transmit by a second power smaller than the first power, the semiconductor integrated circuit including a first transistor and an attenuator.

The first transistor is configured to receive and amplify a transmission signal in the second transmission power mode. The attenuator includes a resistor element and a switching element, which are provided between an output of the first transistor and an output terminal, and are configured to control attenuation of an output signal of the first transistor.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
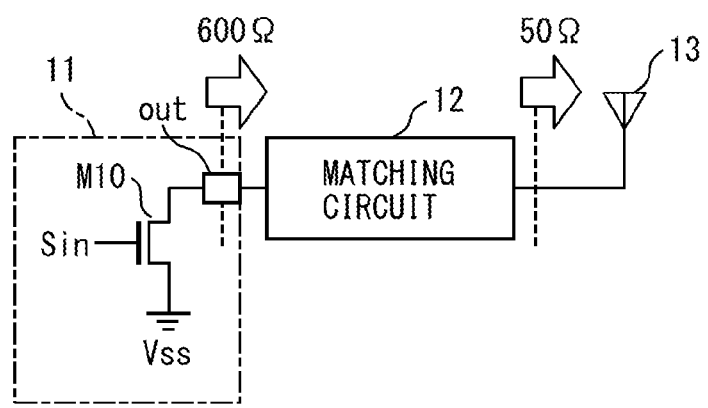
FIG. 1 is a block diagram for explaining an example of a wireless transmitter.
Figure 1:
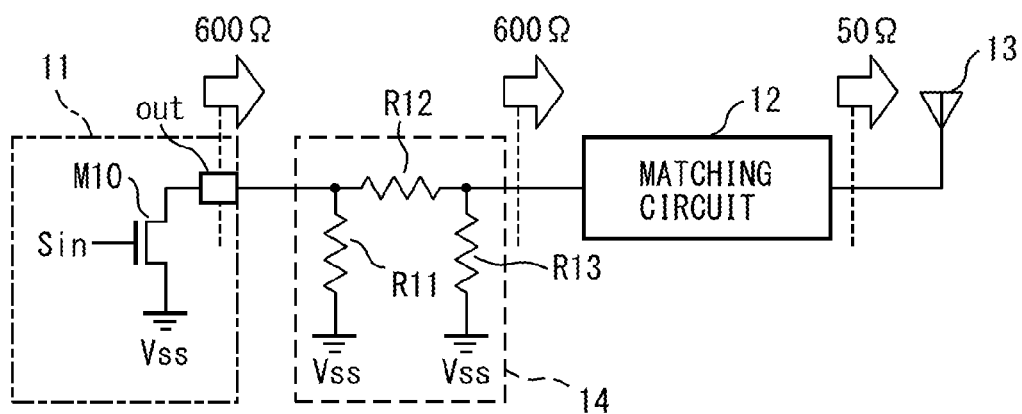

First, before describing embodiments of a semiconductor integrated circuit and a wireless transmitter, an example of a wireless transmitter and problems thereof will be described with reference to FIG. 1. FIG. 1 is a block diagram for explaining an example of a wireless transmitter, FIG. 1(a) depicts a case of a normal transmission power (for example, transmission power of −10 dBm), and FIG. 1(b) depicts a case of an ultra-low transmission power (for example, transmission power of −50 dBm).

The wireless transmitter includes a semiconductor integrated circuit (LSI chip) 11, a matching circuit 12 and an antenna (output antenna) 13. The LSI chip 11 includes a transistor (n-channel type MOS transistor) M10 whose gate receives a transmission signal Sin, whose source is connected to a low-potential power supply line (voltage Vss), and whose drain is connected to an output terminal out of the LSI chip.

First, as depicted in FIG. 1(a), during the normal transmission power, the drain (output terminal out) of the transistor M10 of a final-stage amplifier is connected to the antenna 13 via the matching circuit 12 which is provided outside of the LSI chip 11.

Note that, for example, an output impedance of the LSI chip 11 (input impedance of the matching circuit 12) is specified to 600Ω, and an output impedance of the matching circuit 12 (input impedance of the antenna 13) is specified to 50Ω. Therefore, a normal transmission power (e.g., −10 dBm) output from the antenna 13 due to the transistor M10 is performed.

In contrast, as depicted in FIG. 1(b), during the ultra-low transmission power, the attenuator 14 is inserted between the output terminal out of LSI chip 11 and the matching circuit 12. The attenuator 14 is a Π-type resistor network, and includes a resistor R12 which is connected in series between the output terminal out and the matching circuit 12, and resistors R11 and R13 which are connected between both ends of the resistor R12 and a low potential power line (Vss), respectively.

Note that, resistance values r11 to r13 of the resistors R11 to R13 are set, for example, to r11=r13=600[Ω], and r12=30 k[Ω]. Specifically, an output impedance of the LSI chip 11 (input impedance of the attenuator 14) and an output impedance of the attenuator (input impedance of the matching circuit 12) are set to 600Ω. Further, an output impedance of the matching circuit 12 (input impedance of the antenna 13) is set to 50Ω. Therefore, the power (e.g., −50 dBm) attenuated by the attenuator 14 of the normal power due to the transistor M10 is transmitted from the antenna 13.

Note that, for example, so as to switch a state of a normal transmission power (normal transmission power mode) depicted in FIG. 1(a), and a state of an ultra-low transmission power (ultra-low transmission power mode) depicted in FIG. 1(b), it should be necessary to provide a low switching loss switch (transistor having a wide gate width) in parallel with the attenuator 14. However, when providing such a switch transistor, a transmission power may exceed the power determined by the short-range wireless standard due to a drain-source feed-through phenomenon of the switching transistor, and the like.

Figure 2:
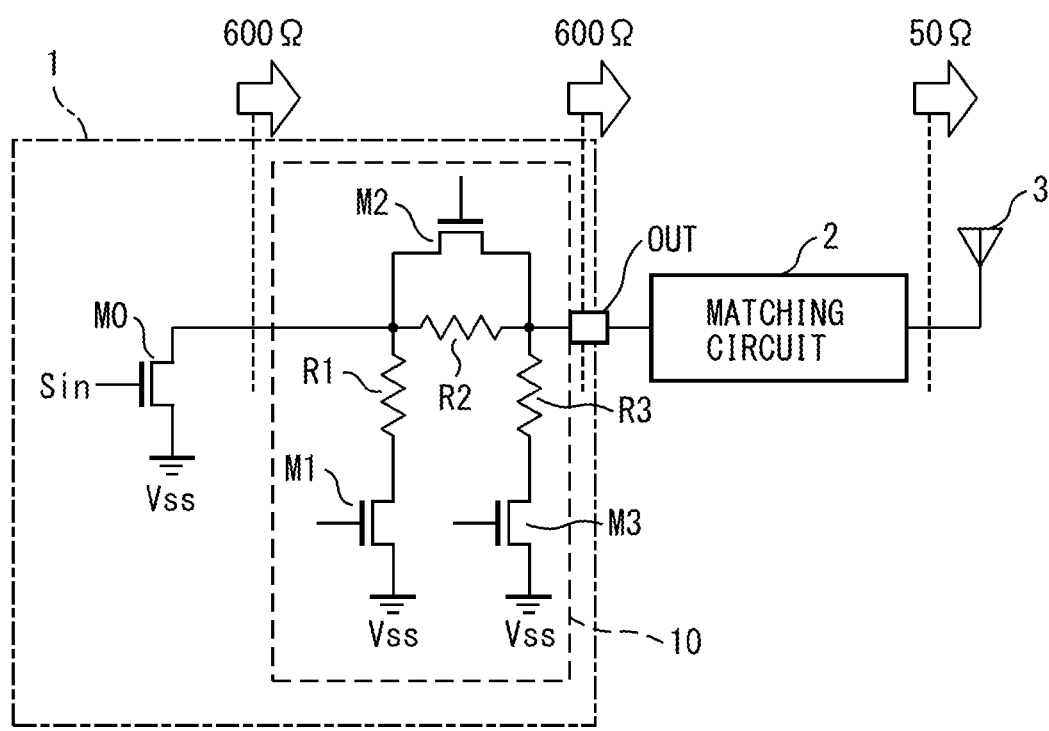
FIG. 2 is a block diagram illustrating a wireless transmitter according to a first embodiment.

Below, embodiments of a semiconductor integrated circuit and a wireless transmitter will be described in detail with reference to the attached drawings. FIG. 2 is a block diagram illustrating a wireless transmitter according to a first embodiment.

As depicted in FIG. 2, the wireless transmitter of the first embodiment includes a semiconductor integrated circuit (LSI chip) 1, a matching circuit 2 and an antenna (output antenna) 3. The LSI chip 1 includes a transistor (n-channel type MOS transistor: first transistor) M0 and an attenuator 10.

The attenuator 10 is a Π-type resistor network, and includes a resistor (resistor element) R2 which is connected in series between a drain of the transistor M0 and an output terminal out, and resistors (resistor elements) R1 and R3 which are connected between both ends of the resistor R2 and a low potential power line (Vss), respectively. Further, the attenuator 10 includes transistors (switching elements: n-channel type MOS transistors: switching transistors) M1 to M3.

Specifically, as is apparent from a comparison of FIG. 2 with previously described FIG. 1(b), in the wireless transmitter of the first embodiment, the LSI chip 1 includes resistors R1 to R3 and transistors M1 to M3, in addition to the transistor M0 of a final-stage amplifier.

Note that, a gate of the transistor M0 of the final-stage amplifier is input with a transmission signal Sin, a source of the transistor M0 is connected to the low-potential power supply line (voltage Vss), and a drain of the transistor M0 is connected to an output terminal OUT of the LSI chip via the resistor R2.

The resistor R1 and the transistor M1 are connected in series, and the resistor R3 and the transistor M3 are connected in series between the two ends of the resistor R2 and the low potential power line (Vss), respectively. Further, the both ends of the resistor R2 are connected with a source and a drain of the transistor M2 which is connected in parallel with the resistor R2.

Note that, the transistors M1 to M3 act as switches, and select switching states between a normal transmission power (normal transmission power mode: for example, power transmission of −10 dBm transmission) and an ultra-low transmission power (ultra-low transmission power mode: for example, power transmission of −50 dBm).

Specifically, in the normal transmission power mode (first transmission power mode), the transistor M2 is turned on and the transistors M1 and M3 are turned off, and conversely, in the ultra-low transmission power mode (second transmission power mode), the transistor M2 is turned off and the transistors M1 and M3 are turned on.

Note that, for example, assuming that a transmission power of the normal transmission power mode is set to −10 dBm, and a transmission power of the ultra-low transmission power mode is set to −50 dBm, the attenuator 10 of the Π-type resistor network including three resistors R1 to R3 attenuates the output power by 40 dB.

Further, for example, so as to match the output impedance of the attenuator 10 to 600Ω, the resistance values r1 to r3 of the resistors R1 to R3 are set to r1=r3=600[Ω], and r2=30 k[Ω].

Figure 3:
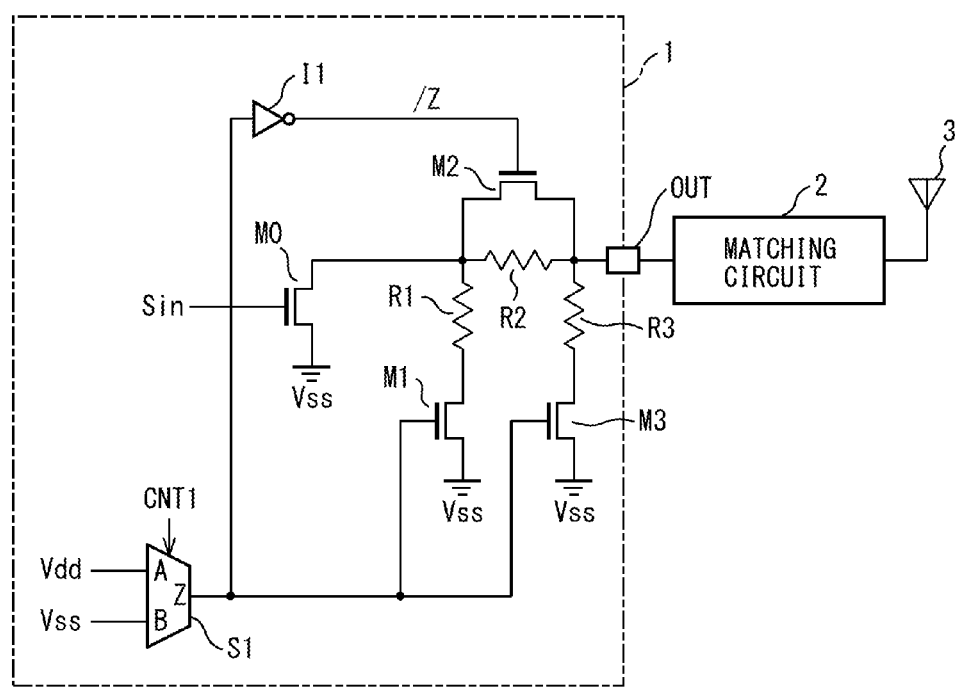
FIG. 3 is a diagram depicting the logic of overall configuration and control signals of a wireless transmitter depicted in FIG. 2.

FIG. 3 is a diagram depicting the logic of overall configuration and control signals of a wireless transmitter depicted in FIG. 2, wherein FIG. 3(a) indicates an entire configuration, and FIG. 3(b) indicates logic of a control signal CNT1.

As depicted in FIG. 3(a), gates of the transistors M1 and M3 are supplied with an output signal (Z) of a selector S1, a gate of the transistor M2 is supplied with a signal (/Z) obtained by inverting the output of the selector S1 by an inverter I1.

Note that, the selector S1 receives a high-potential power supply voltage (power supply voltage) Vdd at one input A and a low-potential power supply voltage (ground voltage) Vss at the other input B. Further, the selector S1 selects the input A when the control signal CNT1 is at a low level "0" and the input B when the control signal CNT1 is at a high level "1", and outputs as a signal Z.

Specifically, as depicted in FIG. 3(b), so as to set the semiconductor integrated circuit 1 as the normal transmission power mode of −10 dBm, the control signal CNT1 is set to "1", the output Z of the selector S1 is selected as the low-potential power supply voltage Vss (input B). Therefore, the transistors M1 and M3 are turned off, and the transistor M2 is turned on, so that the above described normal transmission power mode is established.

On the other hand, so as to set the semiconductor integrated circuit 1 as the ultra-low transmission power mode of −50 dBm, the control signal CNT1 is set to "0", the output Z of the selector S1 is selected as the high-potential power supply voltage Vdd (input A). Therefore, the transistors M1 and M3 are turned on, and the transistor M2 is turned off, so that the above described ultra-low transmission power mode is established.

As described above, according to the wireless transmitter (semiconductor integrated circuit) of the first embodiment, it is possible to switch the normal transmission power mode and the ultra-low transmission power mode with a simple circuit configuration.

Figure 4:
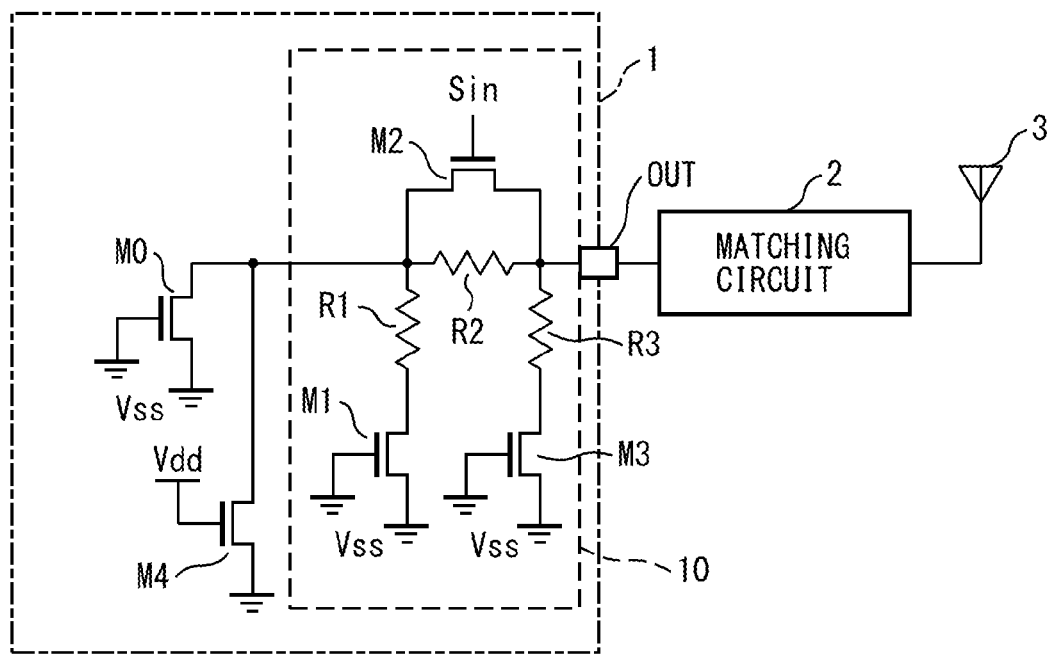
FIG. 4 is a block diagram illustrating a wireless transmitter according to a second embodiment.
Figure 4:
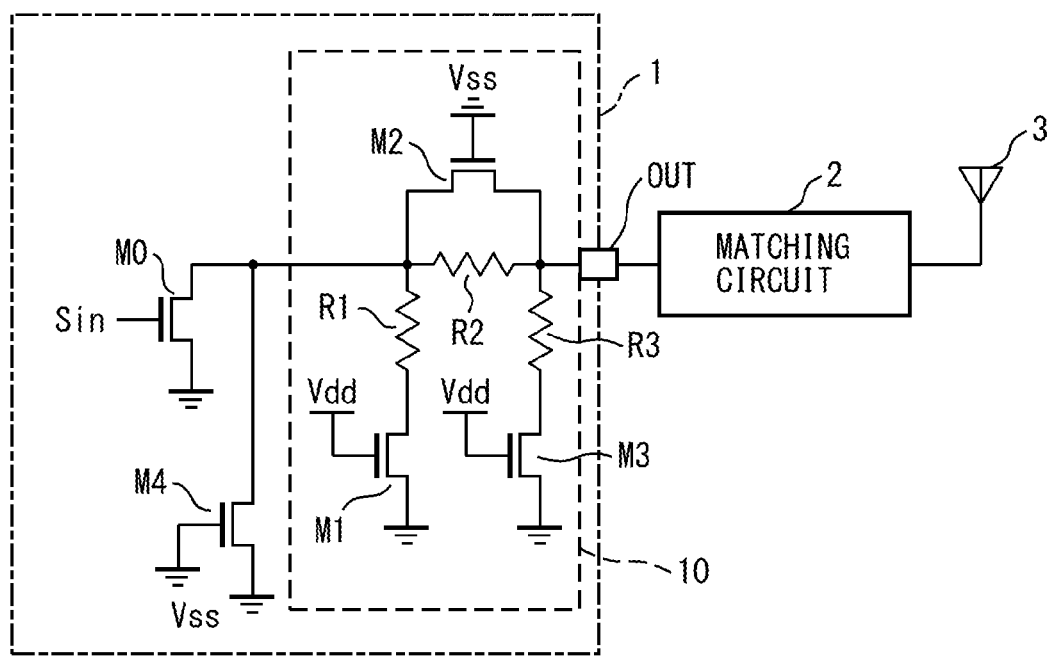

FIG. 4 is a block diagram illustrating a wireless transmitter according to a second embodiment, wherein FIG. 4(a) indicates a normal transmission power (for example, power transmission of −10 dBm), and FIG. 4(b) indicates an ultra-low transmission power (for example, power transmission of −50 dBm).

In the LSI chip 1 by explaining with reference to FIG. 2 and FIG. 3, for example, in the normal transmission power mode, the transistor M2 is turned on so that the drain of the transistor M0 is connected to the output terminal OUT, however, power efficiency of the transmitter is reduced due to insertion of the transistor M2.

Specifically, for example, considering an operation in the transmission power of −10 dB of the normal transmission power mode, the transistor M2 is preferable to include a size (wide gate width) as large as possible so as to reduce the insertion loss.

Nevertheless, when increasing the size of the transistor M2, for example, in the transmission power of −50 dB of the ultra-low transmission power mode, unnecessary power due to a parasitic capacitance between the drain-source of the transistor may be transmitted from the antenna 13. The wireless transmitter of the second embodiment depicted in FIG. 4 is intended to solve such problems.

As apparent from a comparison FIG. 4(a) and FIG. 4(b), and FIG. 2 described above, in the wireless transmitter of the second embodiment, the LSI chip 1 further includes a large size switching transistor (n-channel type MOS transistor) M4 provided in parallel with the transistor M0.

First, as depicted in FIG. 4(a), in the normal transmission power mode (first transmission power mode), a transmission signal Sin is input to the gate of the transistor M2, a low-potential power supply voltage Vss is applied to the gate of the transistor M0, and a high-potential power supply voltage Vdd to the gate of the transistor M4. Therefore, the transistor M0 is turned off, and the transistor M4 is turned on. Note that, the transistors M1 and M3 are turned off by applying the low-potential power source voltage Vss to their gates.

On the other hand, as depicted in FIG. 4(b), in the ultra-low transmission power mode (second transmission power mode), the transmission signal Sin is input to the gate of the transistor M0, and the low-potential power supply voltage Vss is applied to the gates of the transistors M2 and M4. Therefore, the transistor M4 is turned off. Note that, the transistors M1 and M3 are turned on by applying a high-potential power supply voltage Vdd to their gates.

Figure 5:
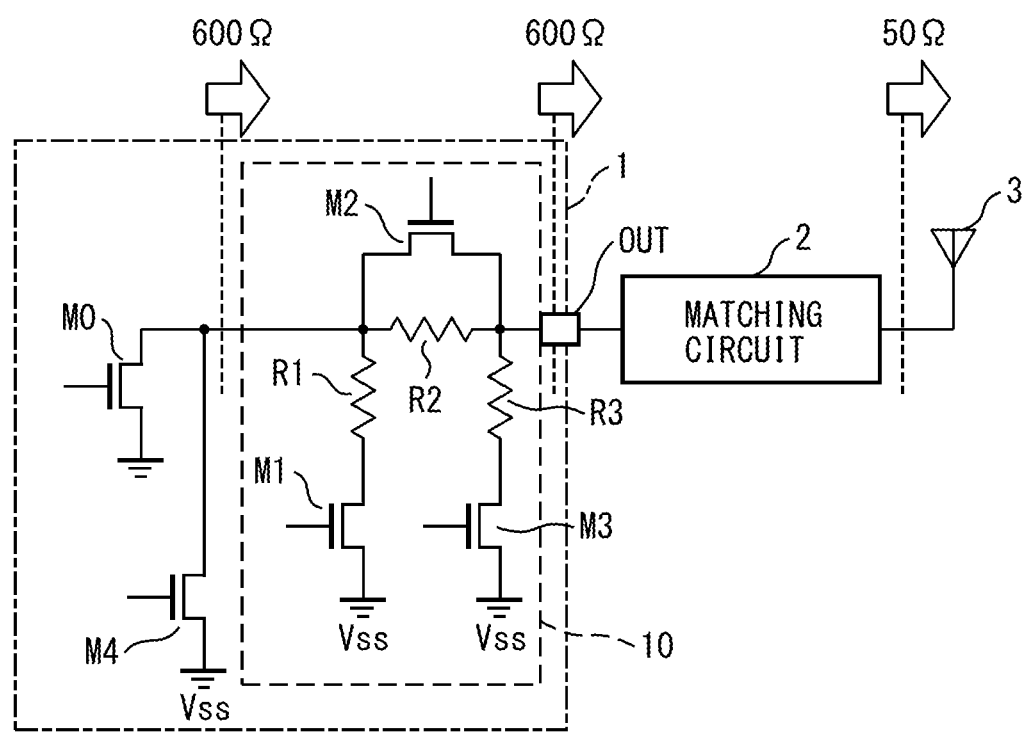
FIG. 5 is a diagram for explaining a transistor size in a wireless transmitter depicted in FIG. 4.

FIG. 5 is a diagram for explaining a transistor size in a wireless transmitter depicted in FIG. 4. With regard to sizes (gate widths) W0 to W4 of the transistors M0 to M4, when determining the size W0 of the transistor M0 at a standard size 1 U, the sizes W1 to W4 of the transistors M1 to M4 are set to, for example, W1=W3=10 U, W2=1 U, and W4=10 U to 20 U.

Specifically, both of the sizes W0 and W2 of the transistors M0 and M2 are determined to the same size 1 U, and this size of 1 U may be defined based on the maximum output value of the wireless transmitter (e.g., −10 dBm). Further, resistance values r1 and r3 of the resistors R1 and R3 may be set, for example, to 600Ω which is an input/output impedance of the attenuator 10 (r1=r3=600[Ω]).

Incidentally, the sizes W0 and W3 of the transistors M1 and M3 connected in series with the resistors R1 and R3 are determined to sufficiently smaller than 600Ω, since if the turned on resistance value is not sufficiently smaller than 600Ω, the input/output impedance of the attenuator 10 deviates from 600Ω.

Further, by considering that the transistors M0 and M2 are elements which are matched with an impedance of 600Ω, the sizes W1 and W3 of the transistors M1 and M3 are preferable to set 10 or more times the sizes W0 and W2 of the transistors M0 and M2.

For example, in a simple calculation example, an impedance of the transistor M1 of which size is ten times of that of the transistor M0 is determined to 60Ω, and a synthetic impedance of the transistor M1 and the resistor R1 connected in series is determined to 660Ω. If the combined impedance of 660Ω is not unacceptable to an impedance matching of 600Ω, the size W1 (W3) of the transistor M1 (M3) may be set to a much larger size.

In addition, the size W4 of the transistor M4 is determined by conditions, for example, how much larger the size W4 of the transistor M4 is set than that of the transistor M2. For example, the size W4 of the transistor M4 is set to a specific value, based on the conditions that the voltage of the source of the transistor M2 (drain of the transistor M4) is always at 0V when the transistor M4 is turned on and the transmission signal Sin is input to the gate of the transistor M2.

According to the second embodiment, it is possible to solve the problems of unnecessary power leakage (feedthrough) of the ultra-low transmission power mode when increasing the size of the transistor M2 in the first embodiment as described above.

Note that, the transistor M4, which includes a large drain parasitic capacitance, for example, in the ultra-low transmission power mode of −50 dBm, and thus an impedance mismatch may occur. However, the impedance mismatch is possible to avoid by adjusting amplitude of the transmission signal Sin of the attenuator 10.

Figure 6:
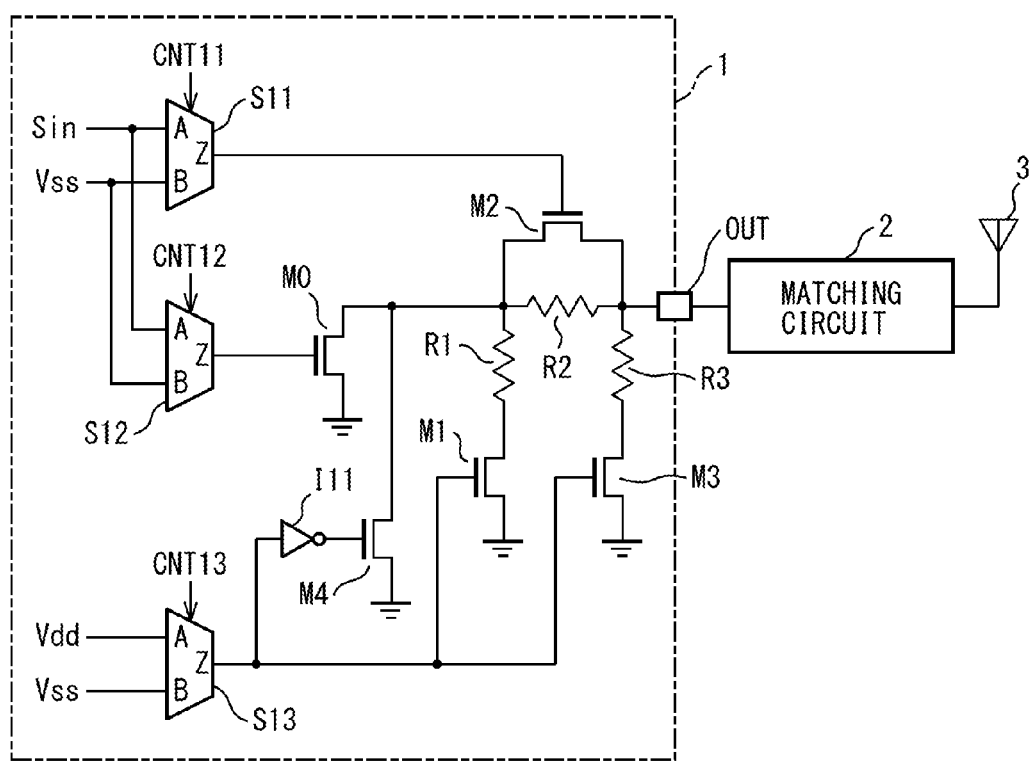
FIG. 6 is a diagram depicting the logic of overall configuration and control signals of a wireless transmitter depicted in FIG. 4.

FIG. 6 is a diagram depicting the logic of overall configuration and control signals of a wireless transmitter depicted in FIG. 4, wherein FIG. 6(a) indicates an entire configuration, and FIG. 6(b) indicates logic of control signals CNT11 to CNT13.

As depicted in FIG. 6(a), a gate of the transistor M2 is supplied with an output signal (Z) of a selector S11, and a gate of the transistor M0 is supplied with an output signal of a selector S12.

The gates of the transistors M1 and M3 are supplied with an output signal of a selector S13, and the gate of the transistor M4 is supplied with a signal (/Z) obtained by inverting the output of the selector S13 by an inverter I11.

Note that, the selector S11, S12 receives the transmission signal Sin at one input A, and receives the low-potential power supply voltage Vss at the other input B, selects the input A when the control signal CNT11, CNT12 is at a low level "0" and outputs as the output signal Z, and selects the input B when the control signal CNT11, CNT12 is at a high level "1" and outputs as the output signal Z.

The selector S13 receives the high-potential power supply voltage Vdd at one input A, and receives the low-potential power supply voltage Vss at the other input B, selects the input A when the control signal CNT13 is at the low level "0" and outputs as the output signal Z, and selects the input B when the control signal CNT13 is at the high level "1" and outputs as the output signal Z.

Specifically, as depicted in FIG. 6(b), so as to set the semiconductor integrated circuit 1 as the normal transmission power mode of −10 dBm, the control signal CNT11 is set to "0", and the control signals CNT12 and CNT13 are set to "1".

Therefore, the output Z of the selector S11 is selected to the transmission signal Sin (input A), the output Z of the selector S12 is selected to the low-potential power source voltage Vss (input B), and the output Z of the selector S13 is selected to the low-potential power source voltage Vss (input B). Consequently, the gate of the transistor M2 is supplied with the transmission signal Sin, the transistors M0, M1 and M3 are turned off, and the transistor M4 is turned on, so that the normal transmission power mode is established.

On the other hand, so as to set the semiconductor integrated circuit 1 as the ultra-low transmission power mode of −50 dBm, the control signal CNT11 is set to "1", and the control signals CNT12 and CNT13 are set to "0".

Therefore, the output Z of the selector S11 is selected to the low-potential power source voltage Vss (input B), the output Z of the selector S12 is selected to the transmission signal Sin (input A), and the output Z of the selector S13 is selected to the high-potential power source voltage Vdd (input A). Consequently, the gate of the transistor M0 is supplied with the transmission signal Sin, the transistors M1 and M3 are turned on, and the transistors M2 and M4 are turned off, so that the ultra-low transmission power mode is established.

As described above, according to the wireless transmitter (semiconductor integrated circuit) of the second embodiment, it is possible to switch a normal transmission power mode and an ultra-low transmission power mode by a simple circuit structure by suppressing power leakage.

Figure 7:
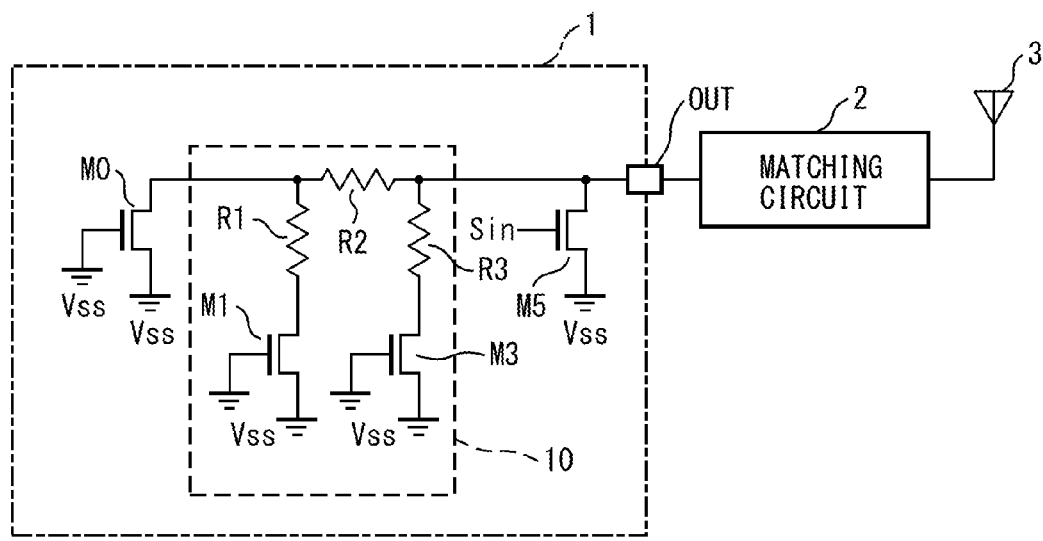
FIG. 7 is a block diagram illustrating a wireless transmitter according to a third embodiment.
Figure 7:
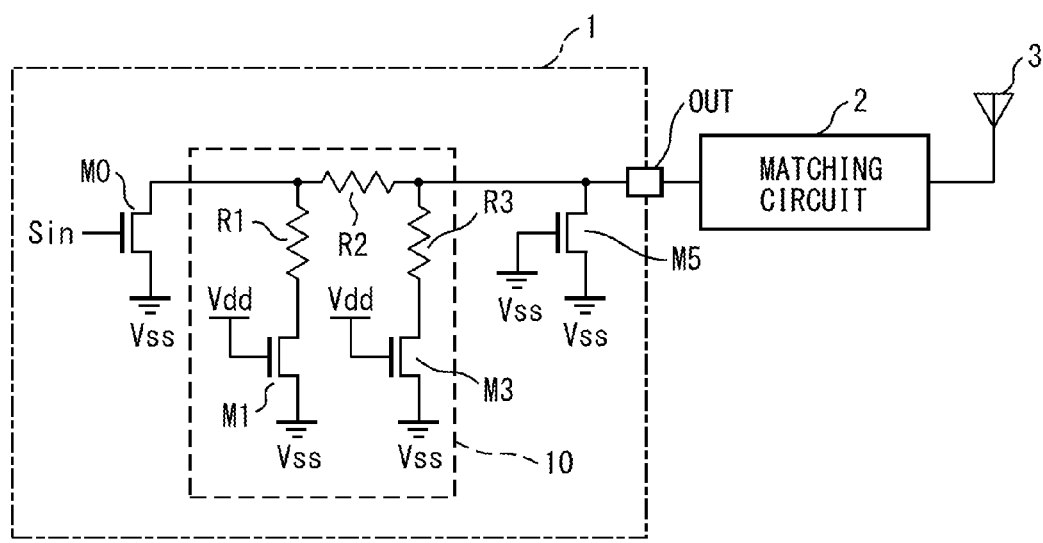

FIG. 7 is a block diagram illustrating a wireless transmitter according to a third embodiment, wherein FIG. 7(a) indicates a normal transmission power (for example, power transmission of −10 dBm), and FIG. 7(b) indicates an ultra-low transmission power (for example, power transmission of −50 dBm).

In the second embodiment by explaining with reference to FIG. 4 to FIG. 6, for example, a large size transistor M4 is used. In contrast, in this third embodiment, the large size transistor M4 is omitted, and instead that a transistor M5 is provided at the output terminal OUT of the LSI chip 1. Note that, the transistor M5 may be equivalent to the transistor M0, and the transistor M2 provided in the attenuator 10 may be also omitted.

Specifically, as depicted in FIG. 7(a), the normal transmission power mode (first transmission power mode), a transmission signal Sin is input to the gate of the transistor M5, and a low-potential power supply voltage Vss is applied to the gate of the transistor M0. Therefore, the transistor M0 is turned off. Note that, the transistors M1 and M3 are also turned off by applying the low-potential power source voltage Vss to their gates.

On the other hand, as depicted in FIG. 7(b), in the ultra-low transmission power mode (second transmission power mode), the transmission signal Sin is input to the gate of the transistor M0, and the low-potential power supply voltage Vss is applied to the gate of the transistor M5. Therefore, the transistor M5 is turned off. Note that, the transistors M1 and M3 are turned on by applying a high-potential power supply voltage Vdd to their gates.

According to the third embodiment, a vertically stacked structure formed by the transistors M2 and M4 in the normal transmission power mode of the second embodiment may be possible to a single stage structure formed by the transistor M5.

Figure 8:
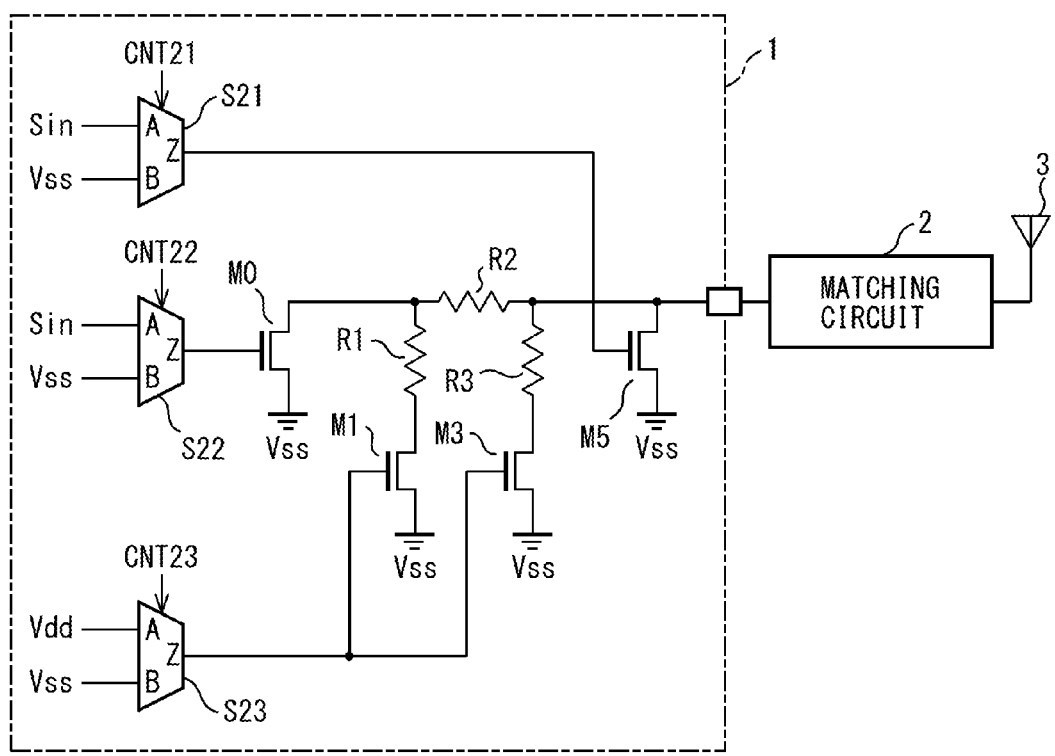
FIG. 8 is a diagram depicting the logic of overall configuration and control signals of a wireless transmitter depicted in FIG. 7.

FIG. 8 is a diagram depicting the logic of overall configuration and control signals of a wireless transmitter depicted in FIG. 7, wherein FIG. 8(a) indicates an entire configuration, and FIG. 8(b) indicates logic of control signals CNT21 to CNT23.

As depicted in FIG. 8(a), a gate of the transistor M5 is supplied with an output signal (Z) of a selector S21, and a gate of the transistor M0 is supplied with an output signal of a selector S22. Further, gates of the transistors M1 and M3 are supplied with an output signal of a selector S23.

Note that, the selector S21, S22 receives the transmission signal Sin at one input A, and receives the low-potential power supply voltage Vss at the other input B, selects the input A when the control signal CNT21, CNT22 is at a low level "0" and outputs as the output signal Z, and selects the input B when the control signal CNT21, CNT22 is at a high level "1" and outputs as the output signal Z.

Further, the selector S23 receives the high-potential power supply voltage Vdd at one input A, and receives the low-potential power supply voltage Vss at the other input B, selects the input A when the control signal CNT23 is at the low level "0" and outputs as the output signal Z, and selects the input B when the control signal CNT23 is at the high level "1" and outputs as the output signal Z.

Specifically, as depicted in FIG. 8(b), so as to set the semiconductor integrated circuit 1 as the normal transmission power mode of −10 dBm, the control signal CNT21 is set to "0", and the control signals CNT22 and CNT23 are set to "1".

Therefore, the output Z of the selector S21 is selected to the transmission signal Sin (input A), the output Z of the selector S22 is selected to the low-potential power source voltage Vss (input B), and the output Z of the selector S23 is selected to the low-potential power source voltage Vss (input B). Consequently, the gate of the transistor M5 is supplied with the transmission signal Sin, and the transistors M0, M1 and M3 are turned off, so that the normal transmission power mode is established.

On the other hand, so as to set the semiconductor integrated circuit 1 as the ultra-low transmission power mode of −50 dBm, the control signal CNT21 is set to "1", and the control signals CNT22 and CNT23 are set to "0".

Therefore, the output Z of the selector S21 is selected to the low-potential power source voltage Vss (input B), the output Z of the selector S22 is selected to the transmission signal Sin (input A), and the output Z of the selector S23 is selected to the high-potential power source voltage Vdd (input A). Consequently, the gate of the transistor M0 is supplied with the transmission signal Sin, and the transistors M1 and M3 are turned on, so that the ultra-low transmission power mode is established.

As described above, according to the wireless transmitter (semiconductor integrated circuit) of the third embodiment, it is possible to switch a normal transmission power mode and an ultra-low transmission power mode by a simple circuit structure by suppressing power leakage, without providing a large size transistor M4 (and transistor M2) which is used in the second embodiment.

In the above, the transmission power of −10 dBm in the normal transmission power mode, and the transmission power of −50 dBm in the ultra-low transmission power mode is merely an example, and it is possible to apply various power values.

Further, each of the transistors is explained as an n-channel type MOS transistor, but a p-channel type MOS transistor may be applied and also various kind of transistors other than MOS transistors may be applied. Further, regarding the attenuator structure, selector, and etc., various modifications may be possible. In addition, logic of the control signals may be changed in accordance with the conductivity type of a transistor, and etc.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor integrated circuit including a first transmission power mode configured to transmit by a first power, and a second transmission power mode configured to transmit by a second power smaller than the first power, the semiconductor integrated circuit comprising:
   a first transistor configured to receive and amplify a transmission signal in the second transmission power mode; and
   an attenuator including a resistor element and a switching element, provided between an output of the first transistor and an output terminal, configured to control attenuation of an output signal of the first transistor, wherein
   in the first transmission power mode, a transistor different from the first transistor receives and amplifies the transmission signal.

2. The semiconductor integrated circuit as claimed in claim 1, wherein
   the switching element is a switching transistor,
   the resistor element includes:
      a first resistor element and a first switching transistor provided in series between an output of the first transistor and a predetermined electric potential line;
      a second resistor element provided between the output of the first transistor and the output terminal; and
      a third resistor element and a third switching transistor provided in series between the output terminal and the predetermined electric potential line, wherein
   in the first transmission power mode, the first and third switching transistors are turned off, and
   in the second transmission power mode, the first and third switching transistors are turned on.

3. The semiconductor integrated circuit as claimed in claim 2, wherein
   the attenuator further includes a second switching transistor provided in parallel with the second resistor element,
   in the first transmission power mode, the second switching transistor receives and amplifies the transmission signal, and the first transistor is turned off, and
   in the second transmission power mode, the second switching transistor is turned off.

4. The semiconductor integrated circuit as claimed in claim 3, wherein the semiconductor integrated circuit further includes a fourth switching transistor of larger size than the first transistor, provided in parallel with the first transistor,
   the fourth switching transistor is turned on in the first transmission power mode, and turned off in the second transmission power mode.

5. The semiconductor integrated circuit as claimed in claim 4, wherein the semiconductor integrated circuit further includes a selector configured to control the first, second, third and fourth switching transistors.

6. The semiconductor integrated circuit as claimed in claim 2, wherein the semiconductor integrated circuit further includes a fifth switching transistor provided between the output terminal and the predetermined potential line, wherein
   in the first transmission power mode, the fifth switching transistor receives and amplifies the transmission signal, and the first transistor is turned off,
   in the second transmission power mode, the fifth switching transistor is turned off.

7. The semiconductor integrated circuit as claimed in claim 6, wherein a size of the fifth switching transistor is approximately equal to a size of the first transistor.

8. The semiconductor integrated circuit as claimed in claim 6, wherein the semiconductor integrated circuit further includes a selector configured to control the first, third and fifth switching transistors.

9. A wireless transmitter comprising:
   a semiconductor integrated circuit including a first transmission power mode configured to transmit by a first power, and a second transmission power mode configured to transmit by a second power smaller than the first power;
   an antenna configured to output the first power of the first transmission power mode and the second power of the second transmission power mode; and
   a matching circuit configured to perform matching of the semiconductor integrated circuit and the antenna, provided between the semiconductor integrated circuit and the antenna, wherein the semiconductor integrated circuit comprising:
      a first transistor configured to receive and amplify a transmission signal in the second transmission power mode; and
      an attenuator including a resistor element and a switching element, provided between an output of the first transistor and an output terminal, configured to control attenuation of an output signal of the first transistor, wherein
   in the first transmission power mode, a transistor different from the first transistor receives and amplifies the transmission signal.

* * * * *